United States Patent
Niwa et al.

(10) Patent No.: US 11,626,540 B2
(45) Date of Patent: Apr. 11, 2023

(54) SEMICONDUCTOR LIGHT-EMITTING ELEMENT AND METHOD OF MANUFACTURING SEMICONDUCTOR LIGHT-EMITTING ELEMENT

(71) Applicant: NIKKISO CO., LTD., Tokyo (JP)

(72) Inventors: Noritaka Niwa, Hakusan (JP); Tetsuhiko Inazu, Hakusan (JP)

(73) Assignee: NIKKISO CO., LTD., Tokyo (JP)

( * ) Notice: Subject to any disclaimer, the term of this patent is extended or adjusted under 35 U.S.C. 154(b) by 97 days.

(21) Appl. No.: 17/012,973

(22) Filed: Sep. 4, 2020

(65) Prior Publication Data

US 2021/0135058 A1    May 6, 2021

(30) Foreign Application Priority Data

Oct. 31, 2019 (JP) .............................. JP2019-198541

(51) Int. Cl.
*H01L 33/38* (2010.01)
*H01L 33/44* (2010.01)
*H01L 33/32* (2010.01)
*H01L 33/00* (2010.01)
(Continued)

(52) U.S. Cl.
CPC .......... *H01L 33/44* (2013.01); *H01L 33/0075* (2013.01); *H01L 33/32* (2013.01); *H01L 33/38* (2013.01); *H01L 33/405* (2013.01); *H01L 33/0012* (2013.01); *H01L 33/145* (2013.01); *H01L 2933/0016* (2013.01); *H01L 2933/0025* (2013.01)

(58) Field of Classification Search
CPC ..... H01L 2933/0016; H01L 2933/0025; H01L 33/0012; H01L 33/0075; H01L 33/145; H01L 33/22; H01L 33/32; H01L 33/38; H01L 33/405; H01L 33/44
See application file for complete search history.

(56) References Cited

U.S. PATENT DOCUMENTS

2004/0159836 A1 * 8/2004 Sugimoto ............. H01L 29/452
257/E29.144
2014/0291714 A1 * 10/2014 Jeon ...................... H01L 33/387
257/98

FOREIGN PATENT DOCUMENTS

JP    2005302747 A    10/2005
JP    2012151261 A    8/2012
(Continued)

*Primary Examiner* — Matthew C Landau
*Assistant Examiner* — Dmitriy Yemelyanov
(74) *Attorney, Agent, or Firm* — Muncy, Geissler, Olds & Lowe, P.C.

(57) ABSTRACT

A semiconductor light-emitting element includes: an n-type semiconductor layer; an active layer; a p-side contact electrode made of Rh; a p-side electrode covering layer made of Ti or TiN that covers the p-side contact electrode; a first protective layer made of $SiO_2$ or SiON that covers an upper surface and a side surface of the p-side electrode covering layer in a portion different from that of a first p-side pad opening; a second protective layer made of $Al_2O_3$ that covers the first protective layer, a side surface of a p-side semiconductor layer, and a side surface of the active layer in a portion different from that of a second p-side pad opening; and a p-side pad electrode that is in contact with the p-side electrode covering layer in the first p-side pad opening and the second p-side pad opening.

5 Claims, 8 Drawing Sheets

(51) Int. Cl.
H01L 33/40 (2010.01)
H01L 33/14 (2010.01)

(56) References Cited

FOREIGN PATENT DOCUMENTS

| JP | 2013171982 A | 9/2013 |
| JP | 6570702 B | 9/2019 |

* cited by examiner

SEMICONDUCTOR LIGHT-EMITTING ELEMENT AND METHOD OF MANUFACTURING SEMICONDUCTOR LIGHT-EMITTING ELEMENT

RELATED APPLICATION

Priority is claimed to Japanese Patent Application No. 2019-198541, filed on Oct. 31, 2019, the entire content of which is incorporated herein by reference.

BACKGROUND OF THE INVENTION

1. Field of the Invention

The present invention relates to a semiconductor light-emitting element and a method of manufacturing a semiconductor light-emitting element.

2. Description of the Related Art

A semiconductor light-emitting element includes an n-type semiconductor layer, an active layer, and a p-type semiconductor layer stacked on a substrate, and a p-side electrode is provided on the p-type semiconductor layer. In a semiconductor light-emitting element in which a nitride semiconductor such as GaN and AlGaN is used, Rh may be selected as a material for the p-side electrode. Further, an insulative film may be formed on the surface of the p-side electrode (see, for example, patent document 1).

The intimacy of contact of a platinum group metal such as Rh with the insulative film that covers the surface of the p-side electrode is not great. Therefore, the insulative film is easily exfoliated from the p-side electrode, which could possibly result in lower reliability of the light-emitting element.

SUMMARY OF THE INVENTION

The present invention addresses the above-described issue, and an illustrative purpose thereof is to improve the reliability of a semiconductor light-emitting element.

A semiconductor light-emitting element according to an embodiment of the present invention includes: an n-type semiconductor layer made of an n-type AlGaN-based semiconductor material; an active layer made of an AlGaN-based semiconductor material provided on a first upper surface of the n-type semiconductor layer; an n-side contact electrode provided to be in contact with a second upper surface of the n-type semiconductor layer; a p-type semiconductor layer provided on the active layer; a p-side contact electrode made of Rh and in contact with an upper surface of the p-type semiconductor layer; a p-side electrode covering layer made of Ti or TiN that covers an upper surface and a side surface of the p-side contact electrode; a first protective layer made of $SiO_2$ or SiON that has a first p-side pad opening provided on a portion of an upper surface of the p-side electrode covering layer, covers the upper surface and a side surface of the p-side electrode covering layer in a portion different from that of the first p-side pad opening; a second protective layer made of $Al_2O_3$ that has a second p-side pad opening that communicates with the first p-side pad opening and covers the first protective layer, a side surface of the p-side semiconductor layer, and a side surface of the active layer in a portion different from that of the second p-side pad opening; and a p-side pad electrode that is in contact with the p-side electrode covering layer in the first p-side pad opening and the second p-side pad opening.

According to the embodiment, the intimacy of contact of the first protective layer with the p-side contact electrode can be enhanced, by providing the p-side electrode covering layer made of Ti or TiN between the p-side contact electrode made of Rh and the first protective layer. Accordingly, exfoliation of the first protective layer from the p-side contact electrode is prevented, the sealing performance exhibited by the first protective layer and the second protective layer can be maintained, and the reliability of the semiconductor light-emitting element can be enhanced.

The second protective layer may have an n-side contact opening provided on a portion of the second upper surface of the n-type semiconductor layer and further cover the second upper surface of the n-type semiconductor layer in a portion different from that of the n-side contact opening. The n-side contact electrode may be in contact with the second surface of the n-type semiconductor layer in the n-side contact opening and overlap the second protective layer at an outer edge of the n-side contact opening.

The p-side electrode covering layer may be provided to be in contact with the p-type semiconductor layer. The first protective layer may further cover the upper surface of the p-type semiconductor layer in a portion different from where the p-side contact electrode and the p-side electrode covering layer are provided.

The semiconductor light-emitting element may further include: a third protective layer made of $SiO_2$ that has a third p-side pad opening provided on the p-side contact electrode and an n-side pad opening provided on the n-side contact electrode, cover the second protective layer in a portion different from that of the third p-side pad opening, and cover the n-side contact electrode in a portion different from that of the n-side pad opening; and an n-side pad electrode provided in the n-side pad opening.

The semiconductor light-emitting element may further include: an n-side electrode covering layer made of Ti or TiN that covers an upper surface and a side surface of the n-side contact electrode and is in contact with the second protective layer. The third protective layer may cover the n-side electrode covering layer in a portion different from that of the n-side pad opening, and the n-side pad electrode may be in contact with the n-side electrode covering layer in the n-side pad opening.

Another embodiment of the present invention relates to a method of manufacturing a semiconductor light-emitting element. The method includes: forming an active layer made of an AlGaN-based semiconductor material on a first upper surface of an n-type semiconductor layer made of an n-type AlGaN-based semiconductor material; forming a p-type semiconductor layer on the active layer; forming a p-side contact electrode made of Rh and in contact with an upper surface of the p-type semiconductor layer; forming a p-side electrode covering layer made of Ti or TiN that covers the p-side contact electrode; forming a first protective layer made of $SiO_2$ or SiON that covers an upper surface of the p-type semiconductor layer and covers an upper surface and a side surface of the p-side electrode covering layer; removing the first protective layer, the p-type semiconductor layer, and the active layer in a region different from a region in which the p-side contact electrode is formed to expose a second upper surface of the n-type semiconductor layer; forming a second protective layer made of $Al_2O_3$ that covers the first protective layer, a side surface of the p-side semiconductor layer, and a side surface of the active layer; forming an n-side contact electrode in contact with a second upper surface of the n-type semiconductor layer; forming a second p-side pad opening that extends through the second protective layer on the p-side contact electrode; forming a first p-side pad opening that extends through the first protective layer on the p-side contact electrode and communicates with the second p-side pad opening; and forming a p-side pad electrode that is in contact with the p-side electrode covering layer exposed in the first p-side pad opening.

According to the embodiment, the intimacy of contact of the first protective layer with the p-side contact electrode can be enhanced, by providing the p-side electrode covering layer made of Ti or TiN between the p-side contact electrode made of Rh and the first protective layer. Accordingly, exfoliation of the first protective layer from the p-side contact electrode is prevented, the sealing performance exhibited by the first protective layer and the second protective layer can be maintained, and the reliability of the semiconductor light-emitting element can be enhanced. In the step of etching the first protective layer to form the first p-side pad opening, the p-side electrode covering layer is caused to function as an etching stop layer, preventing a damage to the p-side contact electrode. Consequently, the reliability of the semiconductor light-emitting element can be enhanced.

The second protective layer may be formed to further cover the second surface of the n-type semiconductor layer, and the method may further include: forming an n-side contact opening provided on a portion of the second upper surface of the n-type semiconductor layer and extending through the second protective layer. The n-side contact electrode may be formed to overlap the second protective layer at an outer edge of the n-side contact opening.

The method may further include: forming, after forming the first p-side pad opening, a third protective layer made of $SiO_2$ that covers the p-side electrode covering layer exposed in the first p-side pad opening, the second protective layer, and the n-side contact electrode; forming a third p-side pad opening that extends through the third protective layer on the p-side contact electrode and forming an n-side pad opening that extends through the third protective layer on the n-side contact electrode; and forming an n-side pad electrode in the n-side pad opening. The p-side pad electrode is formed after the third p-side pad opening is formed.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which.

DETAILED DESCRIPTION OF THE INVENTION

Figure 1:
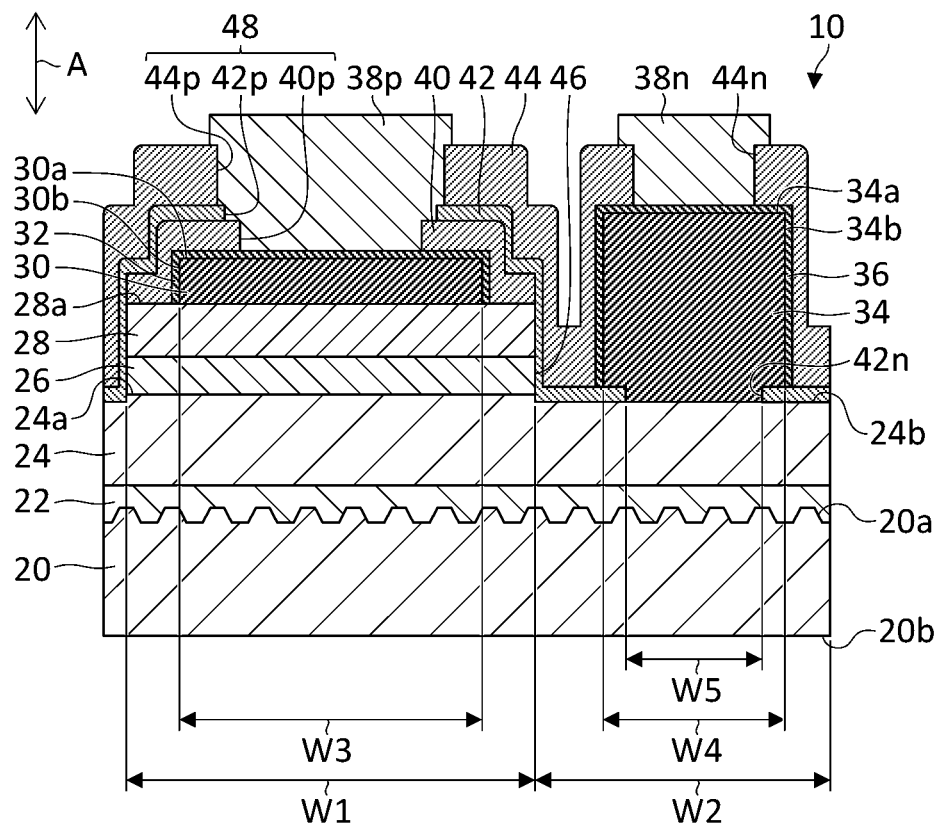
FIG. 1 is a cross sectional view schematically showing a configuration of a semiconductor light-emitting element according to the embodiment.

The invention will now be described by reference to the preferred embodiments. This does not intend to limit the scope of the present invention, but to exemplify the invention.

A detailed description will be given of an embodiment of the present invention with reference to the drawings. The same numerals are used in the description to denote the same elements, and a duplicate description is omitted as appropriate. To facilitate the understanding, the relative dimensions of the constituting elements in the drawings do not necessarily mirror the relative dimensions in the actual light-emitting element.

The semiconductor light-emitting element according to the embodiment is configured to emit "deep ultraviolet light" having a central wavelength A of about 360 nm or shorter and is a so-called deep ultraviolet-light-emitting diode (UV-LED) chip. To output deep ultraviolet light having such a wavelength, an aluminum gallium nitride (AlGaN)-based semiconductor material having a band gap of about 3.4 eV or larger is used. The embodiment particularly shows a case of emitting deep ultraviolet light having a central wavelength A of about 240 nm-320 nm.

In this specification, the term "AlGaN-based semiconductor material" refers to a semiconductor material containing at least aluminum nitride (AlN) and gallium nitride (GaN) and shall encompass a semiconductor material containing other materials such as indium nitride (InN). Therefore, "AlGaN-based semiconductor materials" as recited in this specification can be represented by a composition $In_{1-x-y}Al_xGa_yN$ (0<x+y≤1, 0<x<1, 0<y<1). The AlGaN-based semiconductor material shall encompass AlGaN or InAlGaN. The "AlGaN-based semiconductor material" in this specification has a molar fraction of AlN and a molar fraction of GaN of 1% or higher, and, preferably, 5% or higher, 10% or higher, or 20% or higher.

Those materials that do not contain AlN may be distinguished by referring to them as "GaN-based semiconductor materials". "GaN-based semiconductor materials" mainly contain GaN or InGaN. Similarly, those materials that do not contain GaN may be distinguished by referring to them as "AlN-based semiconductor materials". "AlN-based semiconductor materials" include AlN or InAlN.

FIG. 1 is a cross sectional view schematically showing a configuration of a semiconductor light-emitting element 10 according to the embodiment. The semiconductor light-emitting element 10 includes a substrate 20, a base layer 22, an n-type semiconductor layer 24, an active layer 26, a p-type semiconductor layer 28, a p-side contact electrode 30, a p-side electrode covering layer 32, an n-side contact electrode 34, an n-side electrode covering layer 36, a p-side pad electrode 38p, an n-side pad electrode 38n, a first protective layer 40, a second protective layer 42, and a third protective layer 44.

Referring to FIG. 1, the direction indicated by the arrow A may be referred to as "vertical direction" or "direction of thickness". In a view of the substrate 20, the direction away from the substrate 20 may be referred to as upward, and the direction toward the substrate 20 may be referred to as downward.

The substrate 20 is a substrate having translucency for the deep ultraviolet light emitted by the semiconductor light-emitting element 10 and is, for example, a sapphire ($Al_2O_3$) substrate. The substrate 20 includes a first principal surface 20a and a second principal surface 20b opposite to the first principal surface 20a. The first principal surface 20a is a principal surface that is a crystal growth surface for growing the layers from the base layer 22 to the p-type semiconductor layer 28. A fine concave-convex pattern having a submicron (1 μm or less) depth and pitch is formed on the first principal surface 20a. The substrate 20 like this is also called a patterned sapphire substrate (PSS). The second principal surface 20b is a principal surface that is a light extraction substrate for extracting the deep ultraviolet light emitted by the active layer 26 outside. The substrate 20 may be an AlN substrate or an AlGaN substrate. The substrate 20 may be an ordinary substrate in which the first principal surface 20a is a flat surface that is not patterned.

The base layer 22 is provided on the first principal surface 20a of the substrate 20. The base layer 22 is a foundation layer (template layer) to form the n-type semiconductor layer 24. For example, the base layer 22 is an undoped AlN layer and is, specifically, an AlN (HT-AlN; High Temperature AlN) layer gown at a high temperature. The base layer 22 may include an undoped AlGaN layer formed on the AlN layer. The base layer 22 may be comprised only of an undoped AlGaN layer when the substrate 20 is an AlN substrate or an AlGaN substrate. In other words, the base layer 22 includes at least one of an undoped AlN layer and an undoped AlGaN layer.

The n-type semiconductor layer 24 is provided on the base layer 22. The n-type semiconductor layer 24 is an n-type AlGaN-based semiconductor material layer. For example, the n-type semiconductor layer 24 is an AlGaN layer doped with silicon (Si) as an n-type impurity. The composition ratio of the n-type semiconductor layer 24 is selected to transmit the deep ultraviolet light emitted by the active layer 26. For example, the n-type semiconductor layer 24 is formed such that the molar fraction of AlN is 25% or higher, and, preferably, 40% or higher or 50% or higher. The n-type semiconductor layer 24 has a band gap larger than the wavelength of the deep ultraviolet light emitted by the active layer 26. For example, the n-type semiconductor layer 24 is formed to have a band gap of 4.3 eV or larger. It is preferable to form the n-type semiconductor layer 24 such that the molar fraction of AlN is 80% or lower, i.e., the band gap is 5.5 eV or smaller. It is more preferable to form the n-type semiconductor layer 24 such that the molar fraction of AlN is 70% or lower (i.e., the band gap is 5.2 eV or smaller). The n-type semiconductor layer 24 has a thickness of about 1 μm-3 μm. For example, the n-type semiconductor layer 24 has a thickness of about 2 μm.

The n-type semiconductor layer 24 is formed such that the concentration of Si as the impurity is not lower than $1\times10^{18}/cm^3$ and not higher than $5\times10^{19}/cm^3$. It is preferred to form the n-type semiconductor layer 24 such that the Si concentration is not lower than $5\times10^{18}/cm^3$ and not higher than $3\times10^{19}/cm^3$, and, preferably, not lower than $7\times10^{18}/cm^3$ and not higher than $2\times10^{19}/cm^3$. In one example, the Si concentration in the n-type semiconductor layer 24 is around $1\times10^{19}/cm^3$ and is in a range not lower than $8\times10^{18}/cm^3$ and not higher than $1.5\times10^{19}/cm^3$.

The n-type semiconductor layer 24 includes a first upper surface 24a and a second upper surface 24b. The first upper surface 24a is where the active layer 26 is formed. The second upper surface 24b is where the active layer 26 is not formed, and the n-side contact electrode 34 and the second protective layer 42 are formed. The first upper surface 24a and the second upper surface 24b have different heights, and the height from the substrate 20 to the first upper surface 24a is larger than the height from the substrate 20 to the second upper surface 24b. The region where the first upper surface 24a is located is defined as "first region W1", and the region where the second upper surface 24b is located is defined as "second region W2". The second region W2 is adjacent to the first region W1.

The active layer 26 is provided on the first upper surface 24a of the n-type semiconductor layer 24. The active layer 26 is made of an AlGaN-based semiconductor material and has a double heterojunction structure by being sandwiched between the n-type semiconductor layer 24 and the p-type semiconductor layer 28. To output deep ultraviolet light having a wavelength of 355 nm or shorter, the active layer 26 is formed to have a band gap of 3.4 eV or larger. For example, the AlN composition ratio of the active layer 26 is selected so as to output deep ultraviolet light having a wavelength of 320 nm or shorter.

The active layer 26 may have, for example, a monolayer or multilayer quantum well structure. The active layer 26 is comprised of a stack of a barrier layer made of an undoped AlGaN-based semiconductor material and a well layer made of an undoped AlGaN-based semiconductor material. The active layer 26 includes, for example, a first barrier layer directly in contact with the n-type semiconductor layer 24 and a first well layer provided on the first barrier layer. One or more pairs of the well layer and the barrier layer may be additionally provided between the first barrier layer and the first well layer. The barrier layer and the well layer have a thickness of about 1 nm-20 nm, and have a thickness of, for example, about 2 nm-10 nm.

The active layer 26 may further include an electron blocking layer directly in contact with the p-type semiconductor layer 28. The electron blocking layer is an undoped AlGaN-based semiconductor material layer and is formed such that the molar fraction of AlN is 40% or higher, and, preferably, 50% or higher. The electron blocking layer may be formed such that the molar fraction of AlN is 80% or higher or may be made of an AlN-based semiconductor material that does not contain GaN. The electron blocking layer has a thickness of about 1 nm-10 nm. For example, the electron blocking layer has a thickness of about 2 nm-5 nm.

The p-type semiconductor layer 28 is formed on the active layer 26. The p-type semiconductor layer 28 is a p-type AlGaN-based semiconductor material layer or a p-type GaN-based semiconductor material layer. For example, the p-type semiconductor layer 28 is an AlGaN layer or a GaN layer doped with magnesium (Mg) as a p-type impurity. The p-type semiconductor layer 28 has a thickness of, for example, about 50 nm-200 nm.

The p-type semiconductor layer 28 may be comprised of a plurality of layers. The p-type semiconductor layer 28 may include, for example, a p-type clad layer and a p-type contact layer. The p-type clad layer is a p-type AlGaN layer having a relatively high AlN ratio as compared with the p-type clad layer and is provided to be directly in contact with the active layer 26. The p-type contact layer is a p-type AlGaN layer or a p-type GaN layer having a relatively low AlN ratio as compared with the p-type clad layer. The p-type contact layer is provided on the p-type clad layer and is provided to be directly in contact with the p-side contact electrode 30.

The composition ratio of the p-type clad layer is selected to transmit the deep ultraviolet light emitted by the active layer 26. For example, the p-type clad layer is formed such that the molar fraction of AlN is 25% or higher, and, preferably, 40% or higher, or 50% or higher. The AlN ratio of the p-type clad layer is, for example, similar to the AlN ratio of the n-type semiconductor layer 24 or larger than the AlN ratio of the n-type semiconductor layer 24. The AlN ratio of the p-type clad layer may be 70% or higher, or 80% or higher. The p-type clad layer has a thickness of about 20 nm-100 nm and has a thickness of, for example, about 30 nm-70 nm.

The p-type clad layer may be comprised of a plurality layers. For example, the p-type clad layer may include a p-type first clad layer and a p-type second clad layer. The p-type first clad layer is a p-type AlGaN layer having a relatively high AlN ratio as compared with the p-type second clad layer and is provided to be directly in contact with the active layer 26. The AlN ratio of the p-type first clad layer is 40% or higher, and, preferably, 50% or higher, or 60% or higher. The p-type second clad layer is a p-type AlGaN layer having a relatively low AlN ratio as compared with the p-type first clad layer and is provided between the p-type first clad layer and the p-type contact layer. The AlN ratio of the p-type second clad layer is higher than the AlN ratio of the p-type contact layer. The AlN ratio of the p-type second clad layer is 25% or higher, and, preferably, 40% or higher, or 50% or higher. The thickness of the p-type first clad layer is about 10 nm-100 nm and, for example, about 15 nm-70 nm. The thickness of the p-type second clad layer is about 5 nm-25 nm, and, for example, about 10 nm-150 nm.

The p-type contact layer is formed such that the AlN ratio is 20% or lower in order to obtain proper ohmic contact with the p-side contact electrode 30. Preferably, the p-type contact layer is formed such that the AlN ratio is 10% or lower, 5% or lower, or 0%. In other words, the p-type contact layer may be made of a p-type GaN-based semiconductor material that does not contain AlN. The p-side contact layer has a thickness of about 2 nm-30 nm and has a thickness of about 10 nm-20 nm.

The p-side contact electrode 30 is provided on the p-type semiconductor layer 28. The p-side contact electrode 30 can be in ohmic contact with the p-type semiconductor layer 28 (e.g., the p-type contact layer) and is made of a material having a high reflectivity for the deep ultraviolet light emitted by the active layer 26. The material having such a property is limited. For example, rhodium (Rh) can be used. By configuring the p-side contact electrode 30 as an Rh layer, the contact resistance relative to the p-type semiconductor layer 28 can be $1\times10^{-2}$ $\Omega\cdot cm^2$ or smaller (e.g., $1\times10^{-4}$ $\Omega\cdot cm^2$ or smaller), and the reflectivity of 60% or higher (e.g., about 60%-65%) for ultraviolet light having a wavelength of 280 nm can be obtained. In this case, it is preferred that the thickness of the Rh layer forming the p-side contact electrode 30 be 50 nm or larger or 100 nm or larger.

The p-side contact electrode 30 is formed inside the first region W1. The region in which the p-side contact electrode 30 is formed is defined as "third region W3". The p-side contact electrode 30 is formed to be in ohmic contact with the p-type semiconductor layer 28 over the entirety of the third region W3 and to have a high reflectivity for deep ultraviolet light over the entirety of the third region W3. It is preferred that the p-side contact electrode 30 be formed to have a uniform thickness over the entirety of the third region W3. This allows the p-side contact electrode 30 to function as a highly efficient reflection electrode that reflects the deep ultraviolet light from the active layer 26 and guides it toward the second principal surface 20b of the substrate 20 and to function as a low-resistance contact electrode over the entirety of the third region W3.

The p-side electrode covering layer 32 is provided to cover the p-side contact electrode 30. The p-side electrode covering layer 32 is provided to cover both an upper surface 30a and a side surface 30b of the p-side contact electrode 30. The p-side electrode covering layer 32 is provided to be in contact with the p-type semiconductor layer 28 at the outer circumference of the p-side contact electrode 30. The p-side electrode covering layer 32 is formed over the entirety of the interface between the p-side contact electrode 30 and the first protective layer 40 and is formed to prevent the p-side contact electrode 30 and the first protective layer 40 from being in direct contact. The p-side electrode covering layer 32 is made of titanium (Ti) or titanium nitride (TiN) having conductivity. The conductivity of TiN having conductivity is $1\times10^{-5}$ $\Omega\cdot m$ or lower, and, for example, about $4\times10^{-7}$ $\Omega\cdot m$. The thickness of the p-side electrode covering layer 32 is 5 nm or larger and is, for example, about 10 nm-100 nm.

The n-side contact electrode 34 is provided on the second upper surface 24b of the n-type semiconductor layer 24. The n-side contact electrode 34 is provided in the second region W2 different from the first region W1 in which the active layer 26 is provided. The n-side contact electrode 34 is formed inside the second region W2. The n-side contact electrode 34 is provided to overlap the second protective layer 42 and is in contact with the second upper surface 24b of the n-type semiconductor layer 24 in an n-side contact opening 42n that extends through the second protective layer 42. The region in which the n-side contact electrode 34 is formed is defined as "fourth region W4", and the region in which the n-side contact electrode 34 is in contact with the n-type semiconductor layer 24 is defined as "fifth region W5". The fourth region W4 is larger than the fifth region W5, and the entirety of the fifth region W5 is accommodated in the fourth region W4.

The n-side contact electrode 34 is made of a material that can be in ohmic contact with the n-type semiconductor layer 24 and has a high reflectivity for the deep ultraviolet light emitted by the active layer 26. The n-side contact electrode 34 includes a Ti layer directly in contact with the n-type semiconductor layer 24 and an aluminum (Al) layer directly in contact with the Ti layer. The thickness of the Ti layer is about 1 nm-10 nm and is preferably 5 nm or smaller, and, more preferably, 1 nm-2 nm. By configuring the Ti layer to have a small thickness, the ultraviolet reflectivity of the n-side contact electrode 34 as viewed from the n-type semiconductor layer 24 is enhanced. The thickness of the Al layer is about 100 nm-1000 nm and is preferably 200 nm or larger. By configuring the Ai layer to have a large thickness, the ultraviolet reflectivity of the n-side contact electrode 34 is enhanced.

For example, the n-side contact electrode 34 is in ohmic contact with the n-type semiconductor layer 24 over the entirety of the fifth region W5. By using a Ti/Al layer as the n-side contact electrode 34, contact resistance of $1\times10^{-2}$ $\Omega \cdot cm^2$ or smaller (e.g., $1\times10^{-3}$ $\Omega \cdot cm^2$ or smaller) can be realized. The n-side contact electrode 34 is formed to result in high reflectivity for deep ultraviolet light over the entirety of the fourth region W4. By configuring the Ti layer to have a small thickness, the reflectivity of 80% or higher (e.g., about 85%-90%) for ultraviolet light having a wavelength of 280 nm of the n-side contact electrode 34 can be obtained.

It is preferred that the n-side contact electrode 34 be formed evenly over the entirety of the fifth region W5. Stated otherwise, it is preferred that the Ti layer and the Al layer forming the n-side contact electrode 34 be stacked in a uniform thickness over the entirety of the fifth region W5. This allows the n-side contact electrode 34 to function as a highly efficient reflection electrode that reflects the ultraviolet light from the active layer 26 and guides it toward the second principal surface 20b of the substrate 20 and to function as a low-resistance contact electrode over the entirety of the fifth region W5 in which the n-side contact electrode 34 is in contact with the n-type semiconductor layer 24. It is preferred that the n-side contact electrode 34 does not contain gold (Au), which could cause reduction in the ultraviolet reflectivity.

The n-side electrode covering layer 36 is provided to cover the n-side contact electrode 34. The n-side electrode covering layer 36 is provided to cover both an upper surface 34a and a side surface 34b of the n-side contact electrode 34. The n-side electrode covering layer 36 is provided to be in contact with the second protective layer 42 at the outer circumference of the n-side contact electrode 34. The n-side electrode covering layer 36 is formed over the entirety of the interface between the n-side contact electrode 34 and the third protective layer 44 and is formed to prevent the n-side contact electrode 34 and the third protective layer 44 from being in direct contact. Like the p-side electrode covering layer 32, the n-side electrode covering layer 36 is made of Ti or TiN having conductivity. The thickness of the n-side electrode covering layer 36 is 5 nm or larger and is, for example, about 10 nm-100 nm.

The p-side pad electrode 38p and the n-side pad electrode 38n (generically referred to as pad electrodes) are portions bonded when the semiconductor light-emitting element 10 is mounted on a package substrate or the like. The p-side pad electrode 38p is provided on the p-side contact electrode 30. The p-side pad electrode 38p is in contact with the p-side electrode covering layer 32 in a p-side pad opening 48 that extends through the first protective layer 40, the second protective layer 42 and the third protective layer 44 and is electrically connected to the p-side contact electrode 30. The n-side pad electrode 38n is provided on the n-side contact electrode 34. The n-side pad electrode 38n is in contact with the n-side electrode covering layer 36 in an n-side pad opening 44n that extends through the third protective layer 44 and is electrically connected to the n-side contact electrode 34. The pad electrodes 38p, 38n are provided to overlap the third protective layer 44.

From the perspective of providing resistance to corrosion, the pad electrodes 38p, 38n are configured to contain Au. For example, the pad electrodes 38p, 38n are comprised of a Ni/Au, Ti/Au, or Ti/Pt/Au stack structure. In the case the pad electrodes 38p, 38n are bonded by gold-tin (AuSn), an AuSn layer embodying the metal joining member may be included in the pad electrodes 38p, 38n.

The first protective layer 40 covers the p-side electrode covering layer 32. The first protective layer 40 has a first p-side pad opening 40p provided on a portion of the upper surface of the p-side electrode covering layer 32 and covers the upper surface and the side surface of the p-side electrode covering layer 32 in a portion different from that of the first p-side pad opening 40p. The first protective layer 40 further covers an upper surface 28a of the p-type semiconductor layer 28. The first protective layer 40 covers a region on the upper surface 28a of the p-type semiconductor layer 28 different from the third region W3 in which the p-side contact electrode 30 is formed, i.e., covers the entirety of the first region W1 excluding the third region W3. Therefore, the first protective layer 40 covers the entirety of the exposed surface of the p-side electrode covering layer 32 and the entirety of the exposed portion of the upper surface 28a of the p-type semiconductor layer 28, excluding the first p-side pad opening 40p. The first protective layer 40 is made of silicon oxide ($SiO_2$) or silicon oxynitride (SiON). The thickness of the first protective layer 40 is 50 nm or larger. For example, the thickness is not less than 100 nm and not more than 500 nm.

The first protective layer 40 is made of a material having a lower refractive index for the deep ultraviolet light output from the active layer 26 than the p-type semiconductor layer 28. The refractive index of the AlGaN-based semiconductor material forming the p-type semiconductor layer 28 depends on the composition ratio and is about 2.1-2.56. Meanwhile, the refractive index of $SiO_2$ forming the first protective layer 40 is about 1.4, and the refractive index of SiON is about 1.4-2.1. By providing the protective layer 40 having a low refractive index, a larger portion of the ultraviolet light from the active layer 26 can be totally reflected at the interface between the p-type semiconductor layer 28 and the first protective layer 40 and guided toward the second principal surface 20b of the substrate 20 that is the light extraction surface. In the case of silicon oxide ($SiO_2$), in particular, the refractive index difference from the p-type semiconductor layer 28 is larger so that the reflection characteristic is further improved.

The first p-side pad opening 40p is formed to provide the p-side pad electrode 38p. The first p-side pad opening 40p is provided on the p-side contact electrode 30 and extends through the first protective layer 40 to expose the p-side electrode covering layer 32. The opening region of the first p-side pad opening 40p is smaller than the third region W3 in which the p-side contact electrode 30 is formed and is accommodated inside the third region W3.

The second protective layer 42 covers the first protective layer 40. The second protective layer 42 has a second p-side pad opening 42p that communicates with the first p-side pad opening 40p and covers the exposed surface of the first protective layer 40 in a portion different from that of the second p-side pad opening 42p. The second protective layer 42 covers the side surface (also referred to as a mesa surface 46) of the n-type semiconductor layer 24, the active layer 26 and the p-type semiconductor layer 28. The second protective layer 42 further has the n-side contact opening 42n provided on a portion of the second upper surface 24b of the n-type semiconductor layer 24 and covers the second upper surface 24b of the n-type semiconductor layer 24 in a portion different from that of the n-side contact opening 42n. The second protective layer 42 is provided across the first region W1 and the second region W2. Therefore, the second protective layer 42 covers the exposed surface of the first protective layer 40, the side surface of the p-type semiconductor layer 28, and the entirety of the side surface of the active layer 26 and exposed portion of the second upper surface 24b of the n-type semiconductor layer 24, excluding the second p-side pad opening 42p and the n-side contact opening 42n. A portion of the second protective layer 42 is sandwiched by the second upper surface 24b of the n-type semiconductor layer 24 and the n-side contact electrode 34 in the fourth region W4 excluding the fifth region W5.

The second protective layer 42 is made of aluminum oxide ($Al_2O_3$). The thickness of the second protective layer 42 may be not less than 10 nm and not more than 50 nm. For example, the thickness may be about 20 nm-30 nm. Covering substantially the entirety of the upper and side surfaces of each of the semiconductor layers with the second protective layer 42 of $Al_2O_3$ provides a protective function that is excellent in moisture resistance. FIG. 1 shows that the mesa surface 46 is perpendicular to the substrate 20. Alternatively, the mesa surface 46 may be sloped at a predetermined angle of slope with respect to the substrate 20. The angle of slope of the mesa surface 46 may be, for example, not less than 40° and less than 55°.

The second protective layer 42 preferably has a tight structure having a high film density. For example, it is preferred to form the second protective layer 42 by using the atomic layer deposition (ALD) method. Further, it is preferred that the second protective layer 42 has a low hydrogen concentration. If the second protective layer 42 contains hydrogen (H) in high concentration, hydrogen spreads to the active layer 26 and the p-type semiconductor layer 28, which may cause degradation in these semiconductor layers. To ensure that $Al_2O_3$ has a low hydrogen concentration, it is preferred to use an oxygen gas ($O_2$) plasma or an ozone gas ($O_3$) instead of water ($H_2O$) as a source of supplying oxygen atoms. In other words, it is preferred to form the second protective layer 42 by the ALD method in which an organic aluminum compound such as trimethylaluminium (TMA) and an $O_2$ plasma or $O_3$ are used as source materials.

The n-side contact opening 42n is formed to provide the n-side contact electrode 34. The n-side contact opening 42n is provided on the second upper surface 24b of the n-type semiconductor layer 24 and extends through the second protective layer 42 to expose the n-type semiconductor layer 24. The opening region (fifth region W5) of the n-side contact opening 42n is smaller than the fourth region W4 in which the n-side contact electrode 34 is formed. Therefore, the n-side contact electrode 34 overlaps the second protective layer 42 at the outer edge of the n-side contact opening 42n.

The second p-side pad opening 42p is formed to provide the p-side pad electrode 38p. The second p-side pad opening 42p is provided on the p-side contact electrode 30 and extends through the second protective layer 42. The second p-side pad opening 42p communicates with the first p-side pad opening 40p to expose the p-side electrode covering layer 32. The opening region of the second p-side pad opening 42p is smaller than the third region W3 in which the p-side contact electrode 30 is formed and is larger than the opening region of the first p-side pad opening 40p. The opening region of the first p-side pad opening 40p is accommodated inside the opening region of the second p-side pad opening 42p.

The third protective layer 44 covers the majority of the second protective layer 42 and the n-side electrode covering layer 36. The third protective layer 44 has a third p-side pad opening 44p provided on the p-side contact electrode 30 and covers the exposed surface the second protective layer 42 in a portion different from that of the third p-side pad opening 44p. The third protective layer 44 further has the n-side opening 44n provided on the n-side contact electrode 34 and covers the exposed surface of the n-side electrode covering layer 36 in a portion different from that of the n-side pad opening 44n. Therefore, the third protective layer 44 is provided to cover the upper surface and the side surface of the n-side electrode covering layer 36 and cover the n-side contact electrode 34. The third protective layer 44 is provided across the first region W1 and the second region W2. The third protective layer 44 covers the majority of the exposed surface of the second protective layer 42 and the entirety of the exposed surface of the n-side electrode covering layer 36, excluding the third p-side pad opening 44p and the n-side pad opening 44n.

The third protective layer 44 is made of $SiO_2$ or SiON. The thickness of the third protective layer 44 is 200 nm or larger and is, for example, about 500 nm-1000 nm. By configuring the third protective layer 44 to have a large thickness, the n-side contact electrode 34, which has a larger thickness than the semiconductor layers, is suitably covered.

The third p-side pad opening 44p is formed to provide the p-side pad electrode 38p. The third p-side pad opening 44p is provided on the p-side contact electrode 30 and extends through the third protective layer 44. The third p-side pad opening 44p communicates with the first p-side pad opening 40p and the second p-side pad opening 42p to expose the p-side electrode covering layer 32. In the illustrated example, the opening region of the third p-side pad opening 44p is larger than the opening region of the first p-side pad opening 40p or the second p-side pad opening 42p. The first p-side pad opening 40p and the second p-side pad opening 42p are accommodated inside the third p-side pad opening 44p. The opening region of the third p-side pad opening 44p may be smaller than the opening region of the first p-side pad opening 40p or the second p-side pad opening 42p.

The n-side pad opening 44n is formed to provide the n-side pad electrode 38n. The n-side pad opening 44n is provided on the n-side contact electrode 34 and extends through the third protective layer 44 to expose the n-side electrode covering layer 36. The opening region of the n-side pad opening 44n is smaller than the fourth region W4 in which the n-side contact electrode 34 is provided. The opening region of the n-side pad opening 44n may be smaller or larger than the opening region (fifth region W5) of the n-side contact opening 42n.

Figure 2:
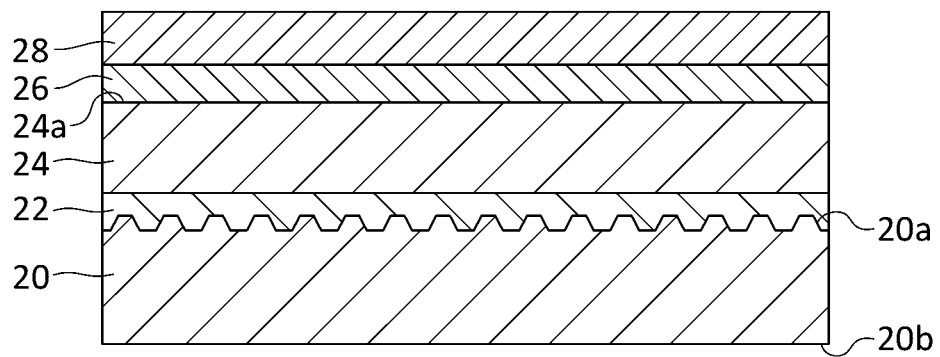
FIG. 2 schematically shows a step of manufacturing the semiconductor light-emitting element.

A description will now be given of a method of manufacturing the semiconductor light-emitting element 10. FIGS. 2-14 schematically show steps of manufacturing the semiconductor light-emitting element 10. Referring to FIG. 2, the base layer 22, the n-type semiconductor layer 24, the active layer 26, and the p-type semiconductor layer 28 are first formed on the first principal surface 20a of the substrate 20 successively. The active layer 26 is formed on the first upper surface 24a of the n-type semiconductor layer 24.

The substrate 20 is a patterned sapphire substrate and is a growth substrate for forming an AlGaN-based semiconductor material. The base layer 22 includes, for example, an AlN (HT-AlN) layer gown at a high temperature and an undoped AlGaN (u-AlGaN) layer. The n-type semiconductor layer 24, the active layer 26, and the p-type semiconductor layer 28 are layers made of an AlGaN-based semiconductor material, an AlN-based semiconductor material, or a GaN-based semiconductor material and can be formed by a well-known epitaxial growth method such as the metal organic vapor phase epitaxy (MOVPE) method and the molecular beam epitaxy (MBE) method.

Figure 3:
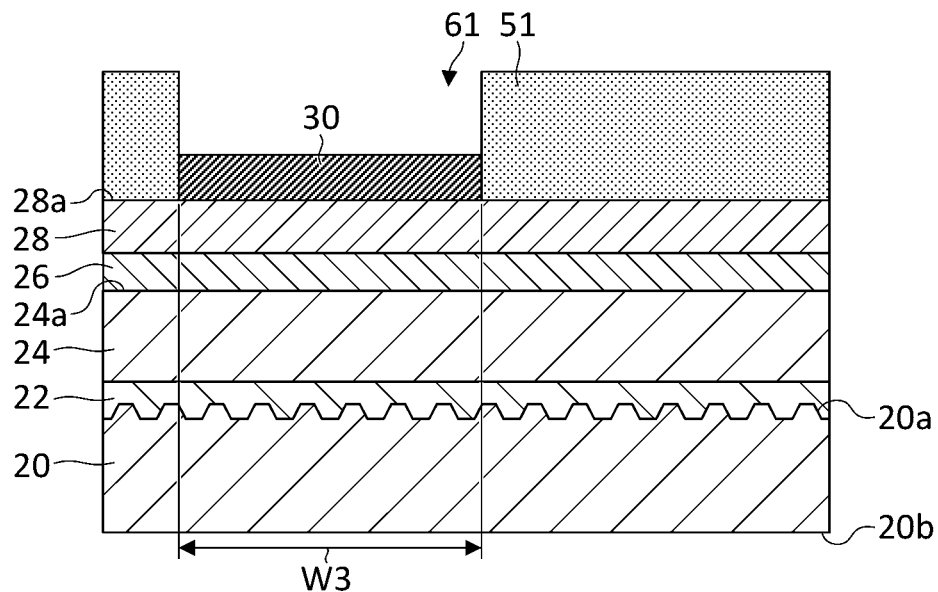
FIG. 3 schematically shows a step of manufacturing the semiconductor light-emitting element.

Subsequently, as shown in FIG. 3, a first mask 51 is formed on the p-type semiconductor layer 28, and the p-side contact electrode 30 is formed in a first opening 61 in which the first mask 51 is not formed. The first mask 51 can be formed by using, for example, a publicly known photolithographic technology. The first opening 61 of the first mask 51 is positioned in the third region W3 in which the p-side contact electrode 30 should be formed. The p-side contact electrode 30 can be formed by sputtering or electron beam (EB) deposition. The p-side contact electrode 30 is in direct contact with the upper surface 28a of the p-type semiconductor layer 28. The p-side contact electrode 30 is annealed after the p-side contact electrode 30 is formed and the first mask 51 is removed.

Figure 4:
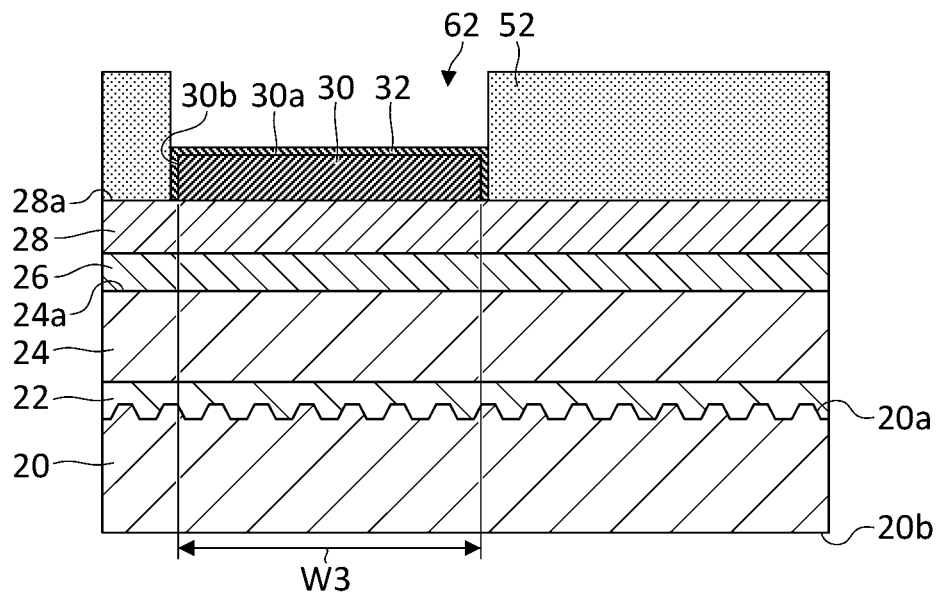
FIG. 4 schematically shows a step of manufacturing the semiconductor light-emitting element.

Subsequently, as shown in FIG. 4, a second mask 52 is formed on the p-type semiconductor layer 28, and the p-side electrode covering layer 32 is formed in a second opening 62 in which the second mask 52 is not provided. The second mask 52 can be formed by using, for example, a publicly known photolithographic technology. The second opening 62 of the second mask 52 is formed in a range slightly larger than the third region W3 and is formed such that the p-side contact electrode 30 is accommodated inside the second opening 62. The p-side electrode covering layer 32 is formed to cover the upper surface 30a and the side surface 30b of the p-side contact electrode 30 and to be in direct contact with the upper surface 28a of the p-type semiconductor layer 28. The p-side electrode covering layer 32 may be formed by, for example, reactive sputtering. After the p-side electrode covering layer 32 is formed, the second mask 52 is removed.

Figure 5:
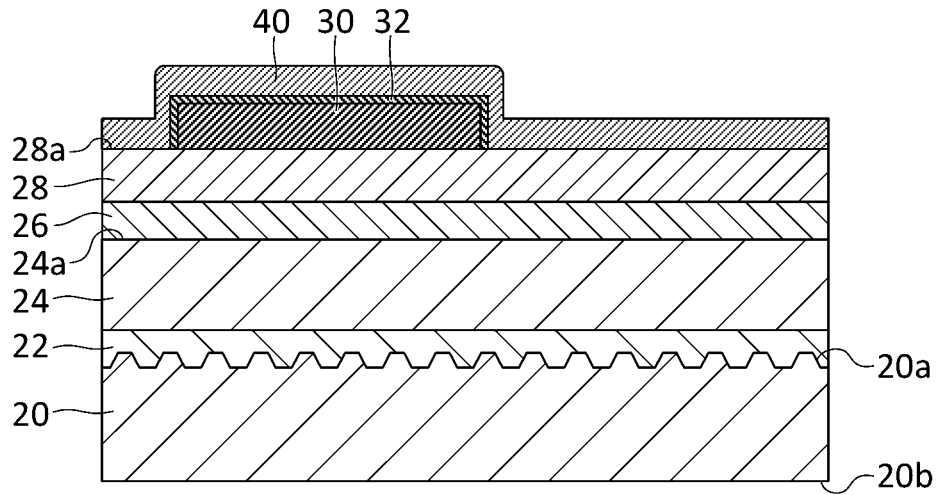
FIG. 5 schematically shows a step of manufacturing the semiconductor light-emitting element.

Subsequently, as shown in FIG. 5, the first protective layer 40 is formed to cover the upper surface 28a of the p-type semiconductor layer 28 and cover the upper surface and the side surface of the p-side electrode covering layer 32. The first protective layer 40 can be formed by a well-known technology such as chemical vapor deposition (CVD).

Figure 6:
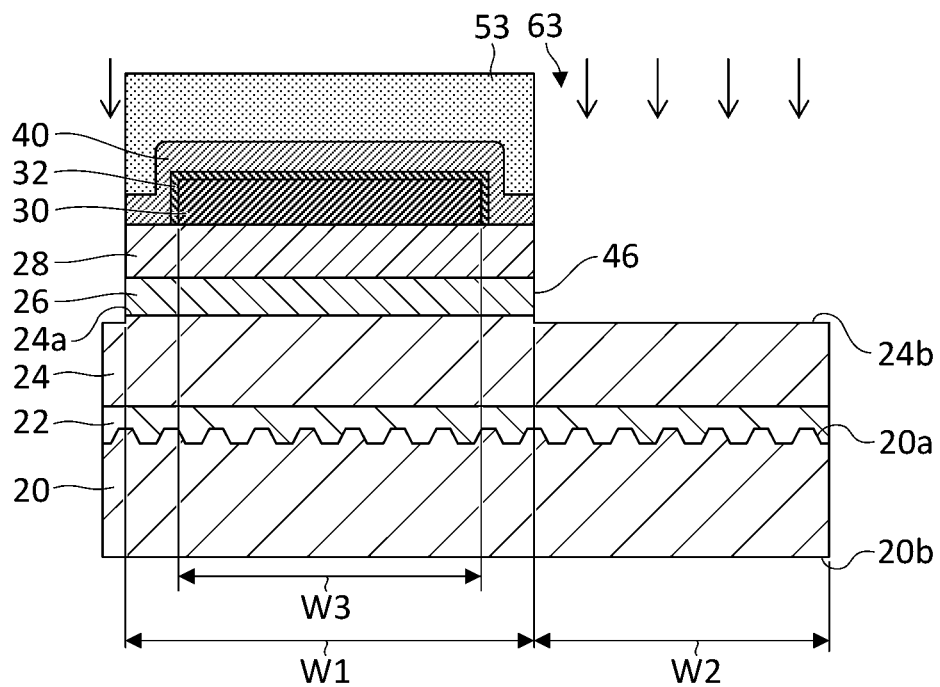
FIG. 6 schematically shows a step of manufacturing the semiconductor light-emitting element.

Subsequently, as shown in FIG. 6, a third mask 53 is formed on the first protective layer 40, and the first protective layer 40, the p-type semiconductor layer 28, and the active layer 26 positioned in a third opening 63, in which the third mask 53 is not provided, are removed by dry-etching. The third mask 53 can be formed by using, for example, a publicly known photolithographic technology. The third mask 53 is formed only in the first region W1, and the third opening 63 is positioned in the second region W2. The dry-etching is performed until the second upper surface 24b of n-type semiconductor layer 24 is exposed in the second region W2. Through this step, the active layer 26 and the p-type semiconductor layer 28 having the mesa surface 46 are formed in the first region W1. Reactive ion etching using a chlorine-based etching gas can be used in the step of forming the mesa surface 46. For example, inductively coupled plasma (ICP) etching may be used. A reactive gas including chlorine (Cl) such as chlorine ($Cl_2$), boron trichloride ($BCl_3$), and silicon tetrachloride ($SiCl_4$) can be used as the etching gas. A reactive gas and an inert gas may be combined for dry etching, and an inert gas such as argon (Ar) may be mixed with the chlorine-based gas. The third mask 53 is removed after the mesa surface 46 is formed.

Figure 7:
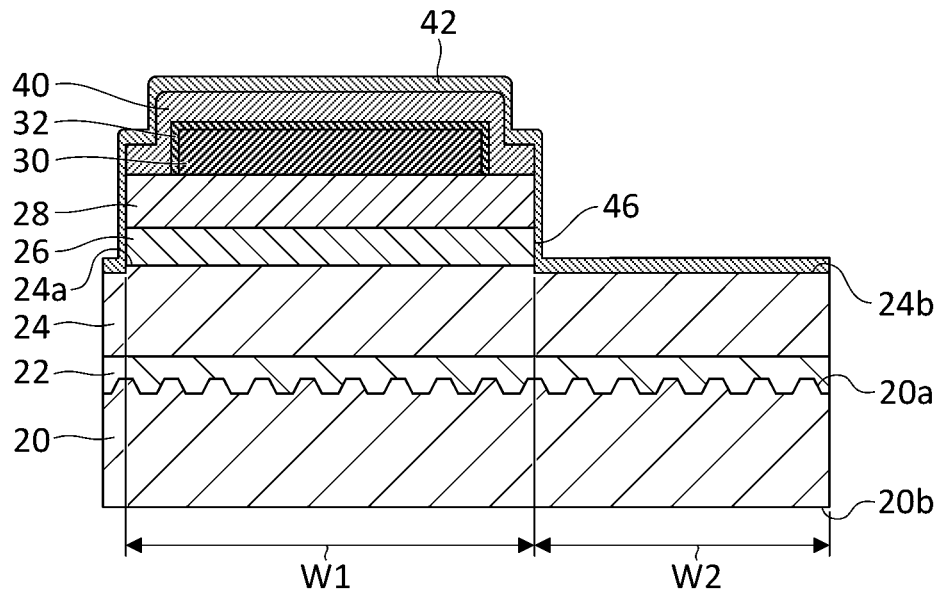
FIG. 7 schematically shows a step of manufacturing the semiconductor light-emitting element.

Subsequently, as shown in FIG. 7, the second protective layer 42 is formed across the first region W1 and the second region W2. The second protective layer 42 covers the first protective layer 40, covers the side surface of the p-type semiconductor layer 28, the side surface of the active layer 26, and the side surface of the n-type semiconductor layer 24 (mesa surface 46), and covers the exposed second upper surface 24b of the n-type semiconductor layer 24. The first protective layer 40 is formed by, for example, the ALD method in which TMA and an $O_2$ plasma or $O_3$ are used as source materials.

Figure 8:
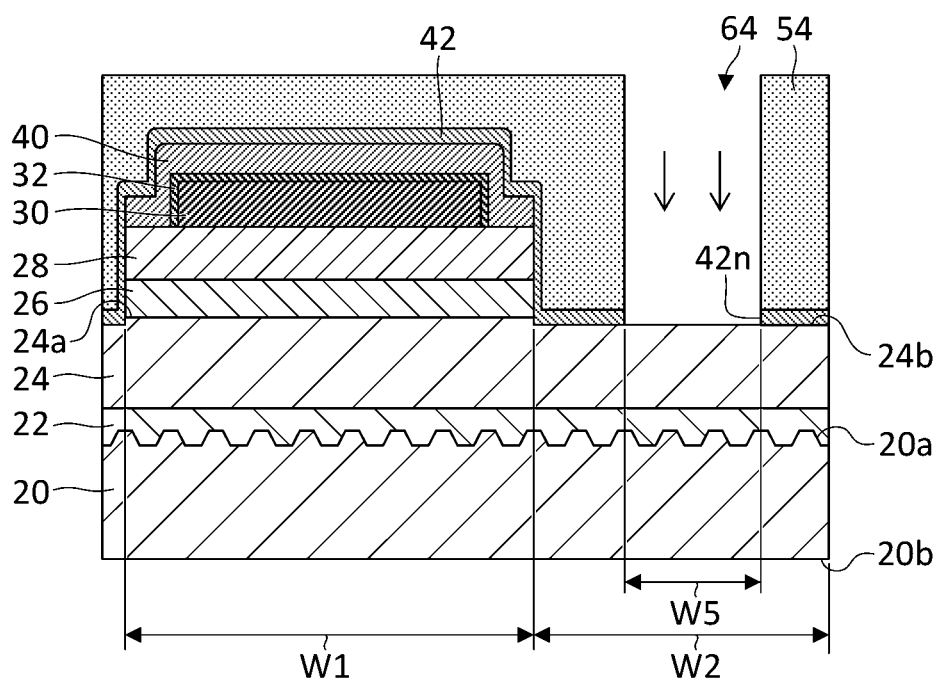
FIG. 8 schematically shows a step of manufacturing the semiconductor light-emitting element.

Subsequently, as shown in FIG. 8, a fourth mask 54 is formed on the second protective layer 42, and the second protective layer 42 positioned in a fourth opening 64, in which the fourth mask 54 is not provided, is removed by dry-etching. The fourth opening 64 is positioned in the fifth region W5 in which the n-side contact opening 42n should be formed. The second protective layer 42 can be dry-etched by using a mixed gas containing a chlorine-based gas and an inert gas. This forms the n-side contact opening 42n that extends through the second protective layer 42, and the n-type semiconductor layer 24 is exposed in the n-side contact opening 42n. The n-side contact opening 42n is provided on a portion of the second upper surface 24b of the n-type semiconductor layer 24. After the n-side contact opening 42n is formed, the fourth mask 54 is removed.

Figure 9:
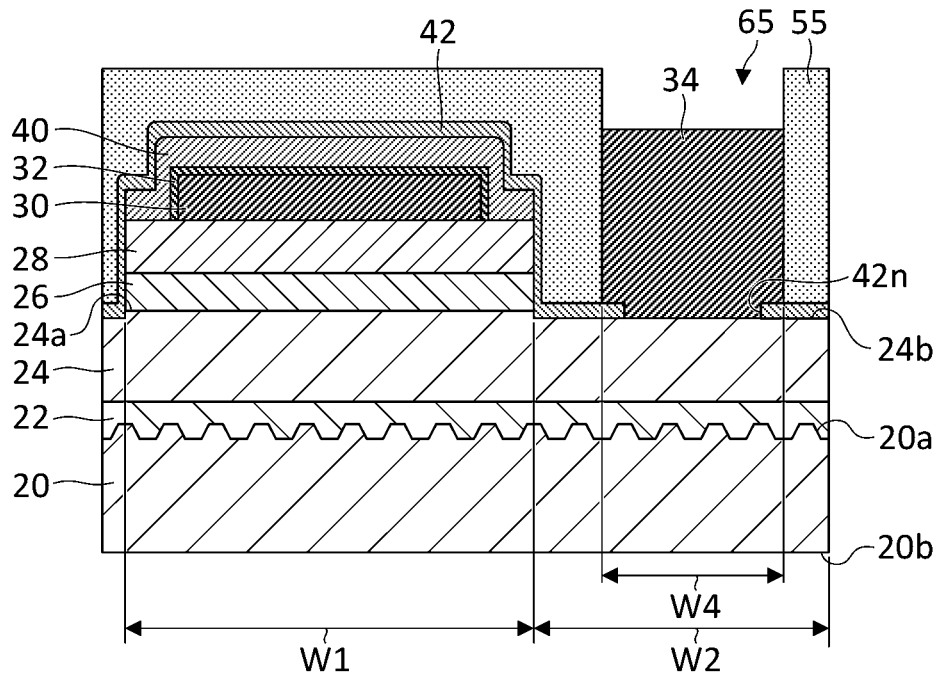
FIG. 9 schematically shows a step of manufacturing the semiconductor light-emitting element.

Subsequently, as shown in FIG. 9, a fifth mask 55 is formed on the second protective layer 42, and the n-side contact electrode 34 is formed in a fifth opening 65 in which the fifth mask 55 is not formed. The fifth mask 55 can be formed by using, for example, a publicly known photolithographic technology. The fifth opening 65 is positioned in the fourth region W4 in which the n-side contact electrode 34 should be formed. The fifth opening 65 is wider than the opening region of the n-side contact opening 42n. The Ti layer is first formed in the fifth opening 65. The Ti layer is in direct contact with the n-type semiconductor layer 24 in the n-side contact opening 42n and is provided to overlap the second protective layer 42 in the n-side contact opening 42n. The Al layer is then formed on the Ti layer. These Ti layer and the Al layer are formed by sputtering or EB deposition.

The fifth mask 55 is then removed, and the n-side contact electrode 34 is annealed. The n-side contact electrode 34 is annealed at a temperature below the melting point of Al (about 660° C.). For example the n-side contact electrode 34 is annealed at a temperature not lower than 550° C. and not higher than 650° C. and, preferably, at a temperature not lower than 560° C. and not higher than 610° C. The film density of the Al layer of the n-side contact electrode 34 of not lower than 2.6 g/cm$^3$ and less than 2.7 g/cm$^3$ ensures that the contact resistance of the n-side contact electrode 34 is $1 \times 10^{-2}$ Ω·cm$^2$ or smaller. The annealing temperature below the melting point of Al enhances the post-annealing flatness of the n-side contact electrode 34 and provides a ultraviolet reflectivity of 80% or higher.

Figure 10:
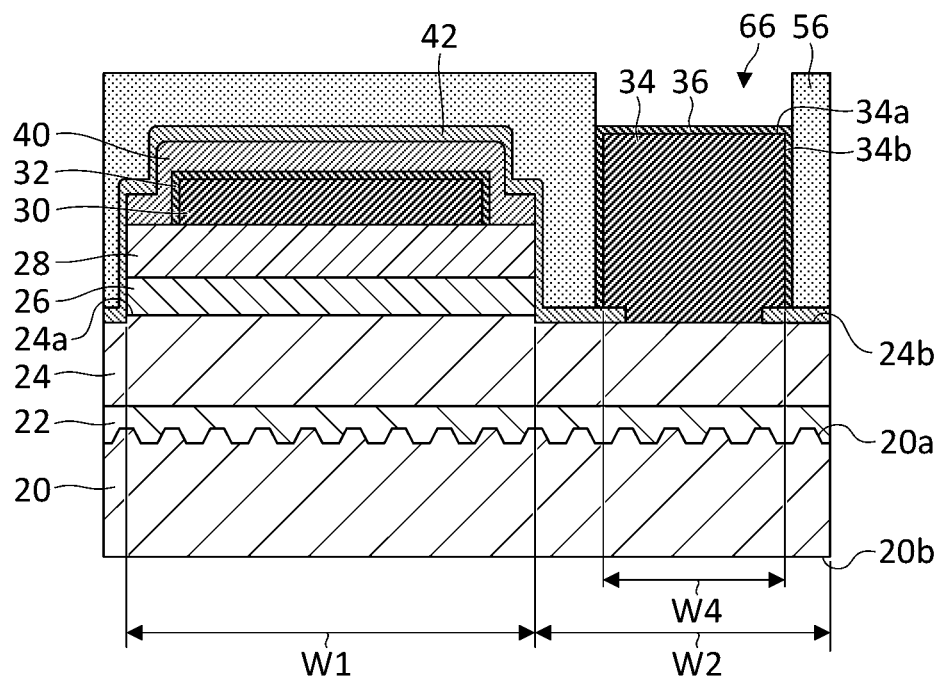
FIG. 10 schematically shows a step of manufacturing the semiconductor light-emitting element.

Subsequently, as shown in FIG. 10, a sixth mask 56 is formed on the second protective layer 42, and the n-side electrode covering layer 36 is formed in the sixth opening 66 in which the sixth mask 56 is not provided. The sixth mask 56 can be formed by using, for example, a publicly known photolithographic technology. The sixth opening 66 of the sixth mask 56 is formed in a range slightly larger than the fourth region W4 and is formed such that the n-side contact electrode 34 is accommodated inside the sixth opening 66. The n-side electrode covering layer 36 is formed to cover the upper surface 34a and the side surface 34b of the n-side contact electrode 34 and to be in contact with the second protective layer 42. The n-side electrode covering layer 36 may be formed by, for example, reactive sputtering. After the n-side electrode covering layer 36 is formed, the sixth mask 56 is removed.

Figure 11:
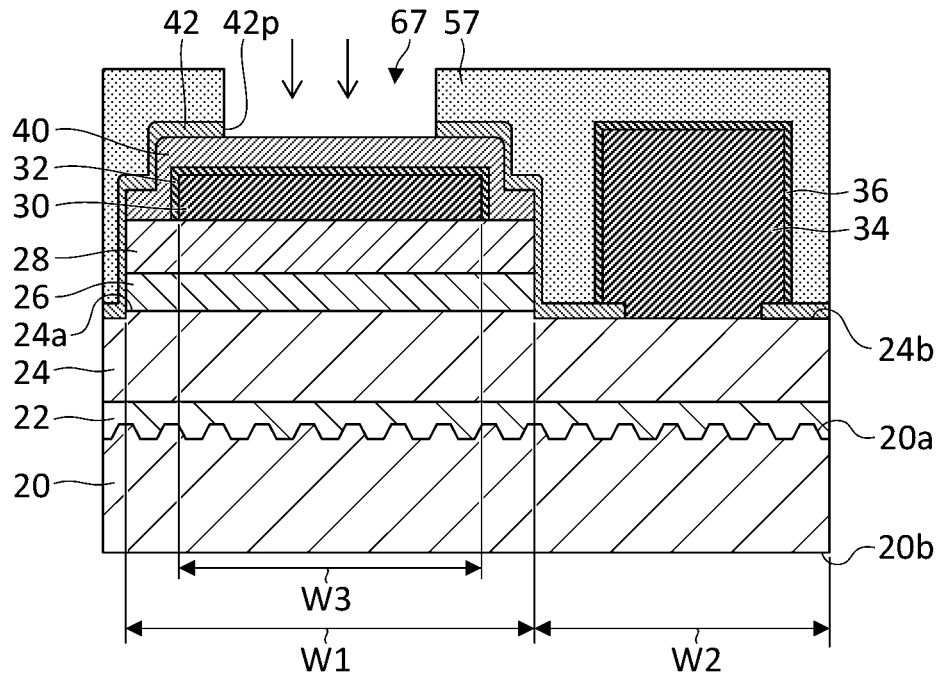
FIG. 11 schematically shows a step of manufacturing the semiconductor light-emitting element.

Subsequently, as shown in FIG. 11, a seventh mask 57 is formed on the second protective layer 42 and the n-side electrode covering layer 36, and the second protective layer 42 is removed in a seventh opening 67 in which the seventh mask 57 is not formed. The seventh mask 57 can be formed by using, for example, a publicly known photolithographic technology. The seventh opening 67 is provided at a position overlapping the p-side contact electrode 30 and is provided in a range narrower than the third region W3 in which the p-side contact electrode 30 is provided. The second protective layer 42 can be dry-etched by using a chlorine-based gas or a mixed gas containing a chlorine-based gas and an inert gas. This forms the second p-side pad opening 42p that extends through the second protective layer 42, and the first protective layer 40 is exposed in the second p-side pad opening 42p. The exposed portion of the first protective layer 40 may be removed to a certain depth in this dry-etching step. After the second p-side pad opening 42p is formed, the seventh mask 57 is removed.

Figure 12:
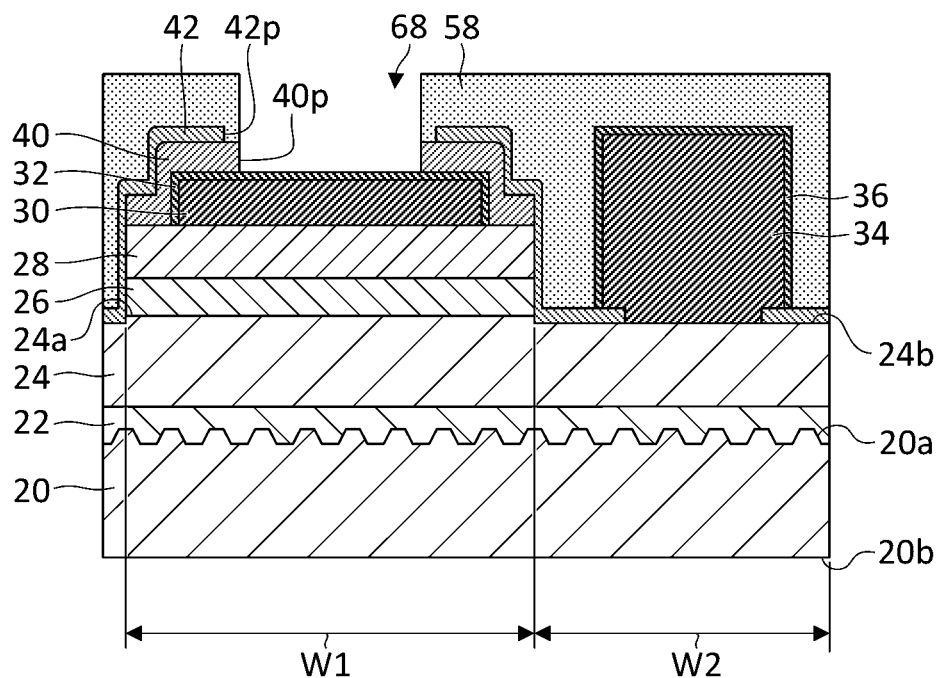
FIG. 12 schematically shows a step of manufacturing the semiconductor light-emitting element.

Subsequently, as shown in FIG. 12, an eighth mask 58 is formed on the first protective layer 40, the second protective layer 42, and the n-side electrode covering layer 36, and the first protective layer 40 is removed in an eighth opening 68 in which the eighth mask 58 is not formed. The eighth mask 58 can be formed by using, for example, a publicly known photolithographic technology. The eighth opening 68 is provided at a position overlapping the p-side contact electrode 30 and is provided in a range narrower than the second p-side pad opening 42p. The eighth mask 58 is provided to cover the exposed surface of the second protective layer 42 completely and is provided to cover and protect the side walls of the second protective layer 42 in the second p-side pad opening 42p. The first protective layer 40 can be dry-etched by using a CF-based etching gas. For example, hexafluoroethane ($C_2F_6$) can be used. This forms the first p-side pad opening 40p that extends through the first protective layer 40, and the p-side electrode covering layer 32 is exposed in the first p-side pad opening 40p. In this dry-etching step, the p-side electrode covering layer 32 functions as an etching stop layer, preventing a damage to the p-side contact electrode 30 below the p-side electrode covering layer 32. After the first p-side pad opening 40p is formed, the eighth mask 58 is removed.

Figure 13:
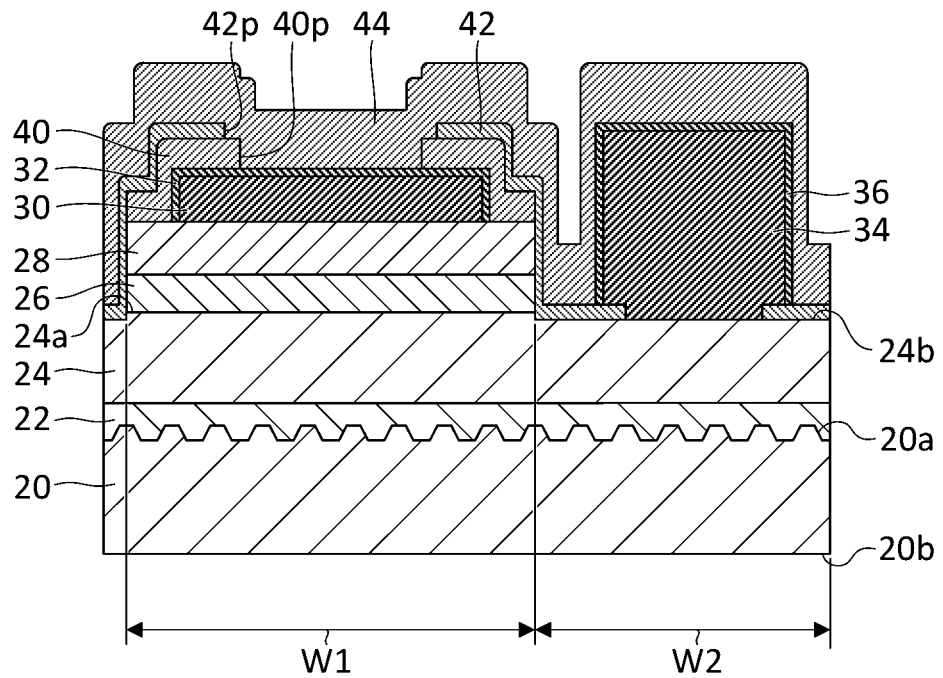
FIG. 13 schematically shows a step of manufacturing the semiconductor light-emitting element.

Subsequently, as shown in FIG. 13, the third protective layer 44 is formed to cover the second protective layer 42 and the n-side electrode covering layer 36. The third protective layer 44 is formed across the first region W1 and the second region W2 and is formed to cover the entirety of the upper surface of the element structure. The third protective layer 44 is formed to cover the p-side electrode covering layer 32 exposed in the first p-side pad opening 40p and the second p-side pad opening 42p. Therefore, the first p-side pad opening 40p and the second p-side pad opening 42p are filled up by the third protective layer 44. The third protective layer 44 can be formed by a well-known technology such as chemical vapor deposition (CVD).

Figure 14:
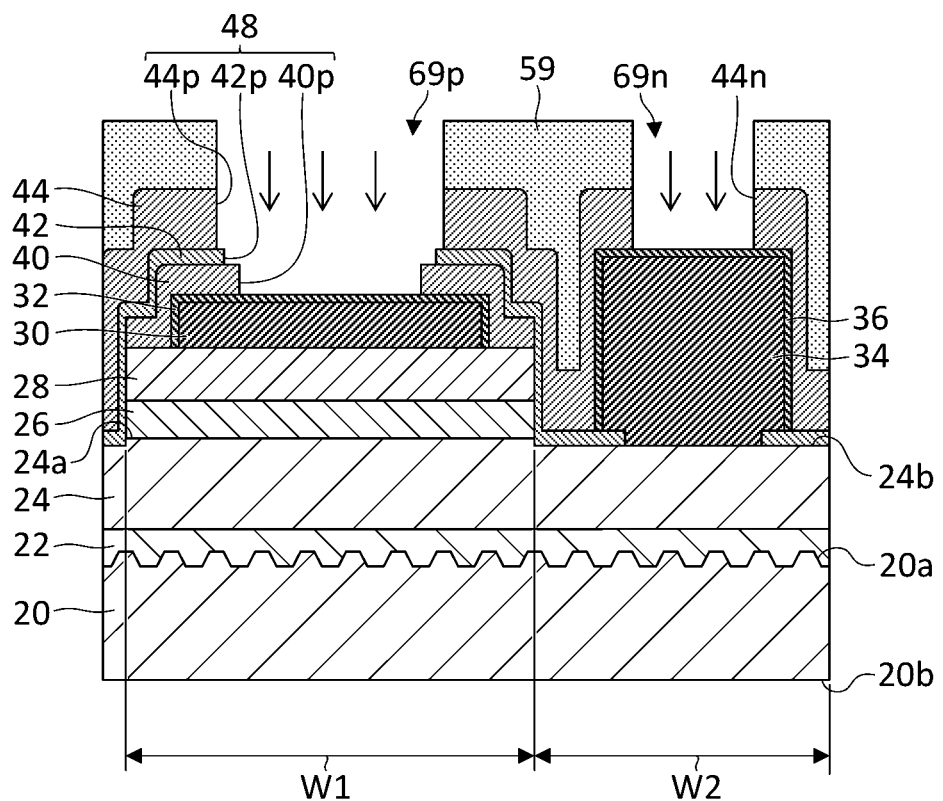
FIG. 14 schematically shows a step of manufacturing the semiconductor light-emitting element.

Subsequently, as shown in FIG. 14, a ninth mask 59 is formed on the third protective layer 44, and the third protective layer 44 is removed in ninth openings 69p, 69n in which the ninth mask 59 is not formed. The ninth mask 59 can be formed by using, for example, a publicly known photolithographic technology. The ninth openings 69p, 69n are positioned above the p-side contact electrode 30 and the n-side contact electrode 34, respectively. The third protective layer 44 can be dry-etched by using a CF-based etching gas. For example, hexafluoroethane ($C_2F_6$) can be used. The third protective layer 44 in the portion of the p-side ninth opening 69p in which the first protective layer 40 and the second protective layer 42 are removed is removed, and the third p-side pad opening 44p that extends through the third protective layer 44 is formed. The third p-side pad opening 44p communicates with the second p-side pad opening 42p and the first p-side pad opening 40p and forms the p-side pad opening 48 that exposes the p-side electrode covering layer 32. In the n-side ninth opening 69n, the third protective layer 44 is removed, and the n-side pad opening 44n that extends through the third protective layer 44 is formed.

In the dry-etching step shown in FIG. 14, as in the dry-etching step shown in FIG. 12, the p-side electrode covering layer 32 and the n-side electrode covering layer 36 function as etching stop layers. Therefore, a damage to the p-side contact electrode 30 and the n-side contact electrode 34 can be prevented, and the low-resistance and high-reflectivity contact electrode can be maintained. In the case the p-side electrode covering layer 32 and the n-side electrode covering layer 36 is made of TiN, in particular, TiN is not so reactive to a fluorine-based etching gas so that by-products from etching are not easily produced. It is therefore ensured that the exposed surface of the p-side electrode covering layer 32 and the n-side electrode covering layer 36 has a high quality even after dry-etching.

Substantially, only the third protective layer 44 is removed in the dry-etching step shown in FIG. 14. It is therefore ensured that the etching depth for forming the n-side pad opening 44n and the etching depth for forming the third p-side pad opening 44p are similar. This is realized by removing the first protective layer 40 and the second protective layer 42, which cover the p-side contact electrode 30, in the steps of FIG. 11 and FIG. 12 before forming the third protective layer 44 in the step shown in FIG. 13. If the first protective layer 40 and the second protective layer 42 on the p-side contact electrode 30 in advance, it would be necessary to remove the first protective layer 40, the second protective layer 42, and the third protective layer 44 on the p-side contact electrode 30 continuously in the dry-etching step shown in FIG. 14. In other words, the first protective layer 40 and the second protective layer 42 on the p-side contact electrode 30 should be removed after the third protective layer 44 on the p-side contact electrode 30 and the n-side contact electrode 34 is removed. This requires continuing the dry-etching step while the n-side electrode covering layer is being exposed and may produce a damage to the n-side electrode covering layer 36. According to this embodiment, on the other hand, the p-side electrode covering layer 32 and the n-side electrode covering layer 36 can be exposed substantially at the same point of time by removing the third protective layer 44 in the dry-etching shown in FIG. 14. Therefore, overetching of the n-side electrode covering layer 36 can be prevented.

Subsequently, the p-side pad electrode 38p is formed in the p-side pad opening 48 on the p-side electrode covering layer 32, and the n-side pad electrode 38n is formed in the n-side pad opening 44n on the n-side electrode covering layer 36. The pad electrodes 38n, 38p can be formed by, for example, building a Ni layer or a Ti layer on the p-side electrode covering layer 32 and the n-side contact electrode 34 and building an Au layer thereon. A further, different metal layer may be provided on the Au layer. For example, a stack structure of an Sn layer, an AuSn layer, and an Sn/Au layer may be formed. The pad electrodes 38n, 38p may be formed by using the ninth mask 59 or formed by using a resist mask separate from the ninth mask 59. After the pad electrodes 38n, 38p are formed, the ninth mask 59 or the separate resist mask is removed. The semiconductor light-emitting element 10 shown in FIG. 1 is completed through the steps described above.

According to the embodiment, the p-side electrode covering layer 32 made of Ti or TiN is provided between the p-side contact electrode 30 and the first protective layer 40. Therefore, the intimacy of contact of the first protective layer 40 with the p-side contact electrode 30 can be enhanced. In particular, the intimacy of contact of Rh, which forms the p-side contact electrode 30, with dielectric materials such as oxides, oxynitrides, and nitrides of silicon or aluminum is not great. In the case of a structure in which the first protective layer 40 is in direct contact with the p-side contact electrode 30, therefore, the first protective layer 40 is easily exfoliated from the p-side contact electrode 30, and the sealing performance exhibited by the first protective layer 40, the second protective layer 42 and the third protective layer 44 such as insulation quality and moisture resistance is lowered. According to this embodiment, by providing the p-side electrode covering layer 32, exfoliation of the first protective layer 40 from the p-side contact electrode 30 is prevented, and the sealing performance exhibited by the protective layers 40, 42, and 44 is prevented from being lowered. This enhances the reliability of the semiconductor light-emitting element 10.

Figure 15:
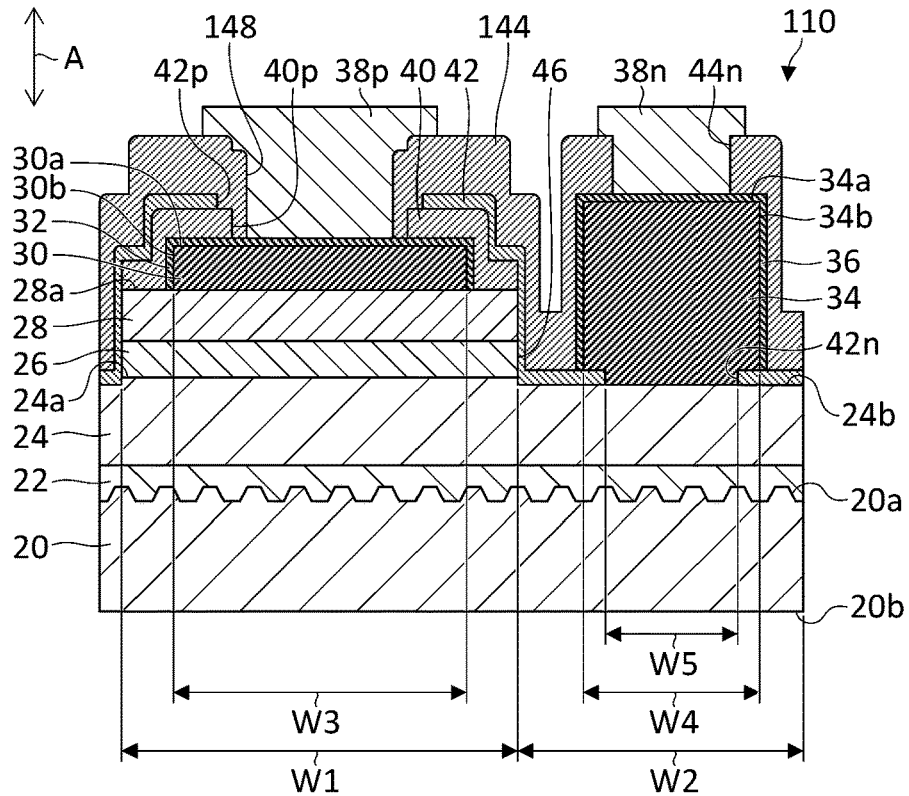
FIG. 15 is a cross sectional view schematically showing a configuration of a semiconductor light-emitting element according to another embodiment.

FIG. 15 is a cross-sectional view schematically showing a configuration of a semiconductor light-emitting element 110 according to another embodiment. This embodiment differs from the embodiment described above in that a p-side pad opening 148 is comprised only of the side walls of a third protective layer 144. The third protective layer 144 is provided to cover the side wall of the first p-side pad opening 40p of the first protective layer 40 and the side wall of the second p-side pad opening 42p of the second protective layer 42. The opening region of the third protective layer 144 forming the p-side pad opening 148 is smaller than the opening region of each of the first p-side pad opening 40p and the second p-side pad opening 42p.

Figure 16:
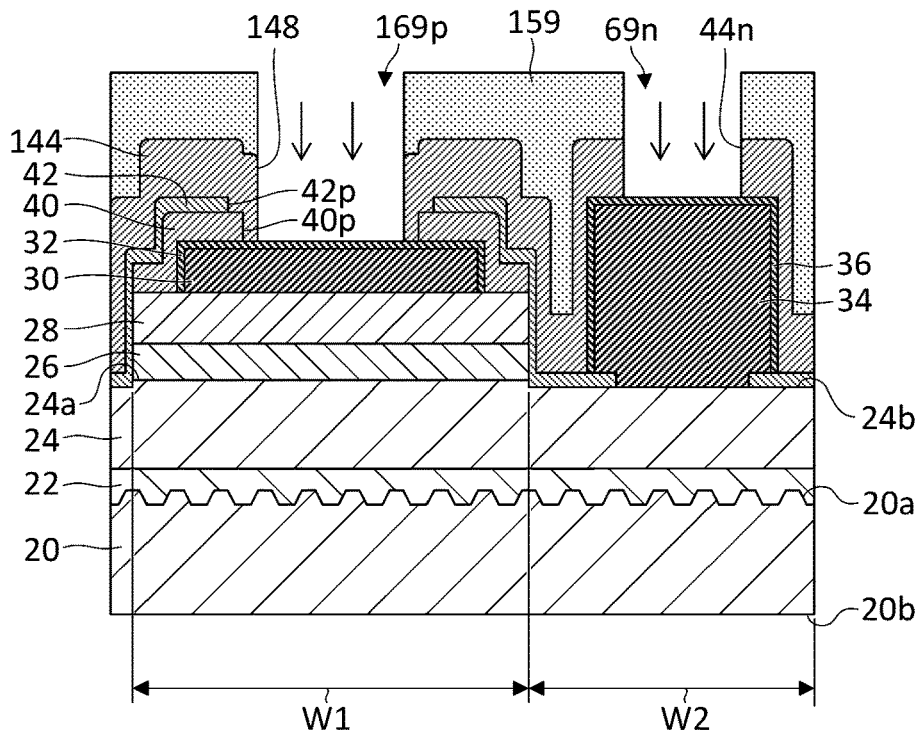
FIG. 16 schematically shows a step of manufacturing the semiconductor light-emitting element of FIG. 15.

FIG. 16 schematically show a step of manufacturing the semiconductor light-emitting element 110 of FIG. 15. FIG. 16 corresponds to the step of FIG. 14 of the embodiment described above. As shown in FIG. 16, the opening region of a p-side ninth opening 169p in which a ninth mask 159 is not provided is narrower than the opening region of each of the first p-side pad opening 40p and the second p-side pad opening 42p. By dry-etching the third protective layer 144 in the p-side ninth opening 169p, the p-side pad opening 148 that extends through the third protective layer 144 is formed, and the p-side electrode covering layer 32 is exposed in the p-side pad opening 148. By forming the pad electrodes 38p, 38n subsequently, the semiconductor light-emitting element 110 shown in FIG. 15 is completed.

The same advantage as that of the foregoing embodiments described above is also achieved in this embodiment.

Described above is an explanation based on an exemplary embodiment. The embodiment is intended to be illustrative only and it will be understood by those skilled in the art that various design changes are possible and various modifications are possible and that such modifications are also within the scope of the present invention.

What is claimed is:

1. A semiconductor light-emitting element comprising:
an n-type semiconductor layer made of an n-type AlGaN-based semiconductor material;
an active layer made of an AlGaN-based semiconductor material provided on a first upper surface of the n-type semiconductor layer;
an n-side contact electrode provided to be in contact with a second upper surface of the n-type semiconductor layer;
a p-type semiconductor layer provided on the active layer;
a p-side contact electrode made of Rh and in contact with an upper surface of the p-type semiconductor layer;
a p-side electrode covering layer made of Ti or TiN that covers an upper surface and a side surface of the p-side contact electrode;
a first protective layer made of $SiO_2$ or SiON that has a first p-side pad opening provided on a portion of an upper surface of the p-side electrode covering layer, covers the upper surface and a side surface of the p-side electrode covering layer in a portion different from that of the first p-side pad opening;
a second protective layer made of $Al_2O_3$ that has a second p-side pad opening that communicates with the first p-side pad opening and covers the first protective layer, a side surface of the p-side semiconductor layer, and a side surface of the active layer in a portion different from that of the second p-side pad opening;
an n-side electrode covering layer made of Ti or TiN that covers an upper surface and a side surface of the n-side contact electrode and is in contact with the second protective layer;
a third protective layer made of $SiO_2$ that has a third p-side pad opening provided on the p-side electrode covering layer and an n-side pad opening provided on the n-side electrode covering layer, covers the second protective layer in a portion different from that of the third p-side pad opening, and covers the n-side electrode covering layer in a portion different from that of the n-side pad opening;
an n-side pad electrode that is in contact with the n-side electrode covering layer in the n-side pad opening; and
a p-side pad electrode that is in contact with the p-side electrode covering layer in the first p-side pad opening, the second p-side pad opening, and the third p-side pad opening.

2. The semiconductor light-emitting element according to claim 1, wherein
the second protective layer further has an n-side contact opening provided on a portion of the second upper surface of the n-type semiconductor layer and further covers the second upper surface of the n-type semiconductor layer in a portion different from that of the n-side contact opening, and
the n-side contact electrode is in contact with the second upper surface of the n-type semiconductor layer in the n-side contact opening and overlaps the second protective layer at an outer edge of the n-side contact opening.

3. The semiconductor light-emitting element according to claim 1, wherein
the p-side electrode covering layer is provided to be in contact with the p-type semiconductor layer, and
the first protective layer further covers the upper surface of the p-type semiconductor layer in a portion different from where the p-side contact electrode and the p-side electrode covering layer are provided.

4. A method of manufacturing a semiconductor light-emitting element, comprising:
forming an active layer made of an AlGaN-based semiconductor material on a first upper surface of an n-type semiconductor layer made of an n-type AlGaN-based semiconductor material;
forming a p-type semiconductor layer on the active layer;
forming a p-side contact electrode made of Rh and in contact with an upper surface of the p-type semiconductor layer;
forming a p-side electrode covering layer made of Ti or TiN that covers the p-side contact electrode;
forming a first protective layer made of $SiO_2$ or SiON that covers an upper surface of the p-type semiconductor layer and covers an upper surface and a side surface of the p-side electrode covering layer;

removing the first protective layer, the p-type semiconductor layer, and the active layer in a region different from a region in which the p-side contact electrode is formed to expose a second upper surface of the n-type semiconductor layer;

forming a second protective layer made of $Al_2O_3$ that covers the first protective layer, a side surface of the p-side semiconductor layer, and a side surface of the active layer;

forming an n-side contact electrode in contact with a second upper surface of the n-type semiconductor layer;

forming an n-side electrode covering layer made of Ti or TiN that covers an upper surface and a side surface of the n-side contact electrode and is in contact with the second protective layer;

forming a second p-side pad opening that extends through the second protective layer on the p-side contact electrode;

forming a first p-side pad opening that extends through the first protective layer on the p-side contact electrode and communicates with the second p-side pad opening;

forming a third protective layer made of $SiO_2$ that covers the p-side electrode covering layer exposed in the first p-side pad opening, the second protective layer, and the n-side electrode covering layer;

forming a third p-side pad opening that extends through the third protective layer on the p-side electrode covering layer;

forming an n-side pad opening that extends through the third protective layer on the n-side electrode covering layer;

forming an n-side pad electrode that is in contact with the n-side electrode covering layer exposed in the n-side pad opening; and forming a p-side pad electrode that is in contact with the p-side electrode covering layer exposed in the first p-side pad opening, the second p-side pad opening and the third p-side pad opening.

5. The method of manufacturing a semiconductor light-emitting element according to claim 4, wherein the second protective layer is formed to further cover the second surface of the n-type semiconductor layer, the method further comprising:

forming an n-side contact opening provided on a portion of the second upper surface of the n-type semiconductor layer and extending through the second protective layer, wherein the n-side contact electrode is formed to overlap the second protective layer at an outer edge of the n-side contact opening.

* * * * *